United States Patent [19]
Baba et al.

[11] Patent Number: 5,866,957
[45] Date of Patent: Feb. 2, 1999

[54] SWITCHING DEVICE

[75] Inventors: Akira Baba; Takaaki Izawa, both of Susono, Japan

[73] Assignee: Yazaki Corporation, Tokyo, Japan

[21] Appl. No.: 870,658

[22] Filed: Jun. 6, 1997

[30] Foreign Application Priority Data

Jun. 7, 1996 [JP] Japan .................................. 8-146015

[51] Int. Cl.$^6$ .................................................. H04J 3/02
[52] U.S. Cl. ........................ 307/113; 307/10.1; 363/101; 323/266; 327/536
[58] Field of Search .............................. 307/113, 28, 33, 307/10.1; 363/101; 323/266; 370/422; 327/536

[56] References Cited

U.S. PATENT DOCUMENTS

| | | | |
|---|---|---|---|
| 4,246,635 | 1/1981 | Arima ...................................... | 363/101 |
| 4,538,101 | 8/1985 | Shimpo et al. ........................... | 323/266 |
| 4,845,708 | 7/1989 | Herrmann et al. ....................... | 370/422 |
| 5,304,935 | 4/1994 | Rathke et al. ............................ | 361/101 |
| 5,689,208 | 11/1997 | Nadd ....................................... | 327/536 |

*Primary Examiner*—Albert W. Paladini
*Attorney, Agent, or Firm*—Sughrue, Mion, Zinn, Macpeak & Seas, PLLC

[57] ABSTRACT

A switching device which can reduce effectively noise that is generated from a charge pump used to generate a drive voltage for driving a plurality of semiconductor switches. In the switching device, the charge pump used to generate the drive voltage for operating the plurality of the semiconductor switches is shared in common by these semiconductor switches, and the plurality of the semiconductor switches can be driven by the drive voltage that is generated by the single charge pump. Due to this structure, the noise to be generated by the charge pump can be controlled to a minimum and the noise interfering into the power line can be removed by a single noise remove circuit, which makes it possible to simplify the structure of the switching device.

5 Claims, 10 Drawing Sheets

FIG. 5A  V$_{IN}$ 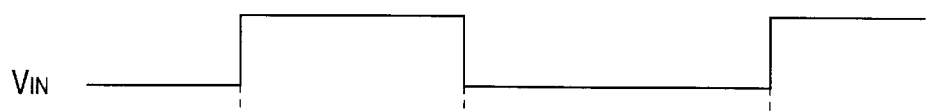
FIG. 5B  CL 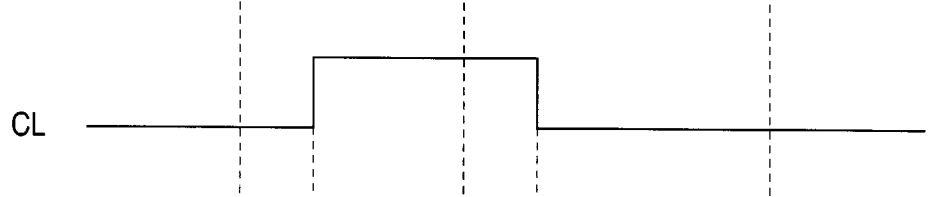
FIG. 5C  R 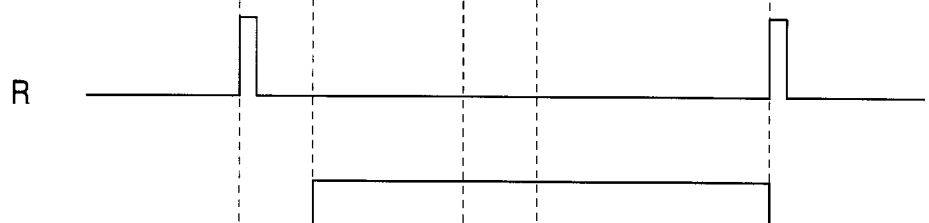
FIG. 5D  Q 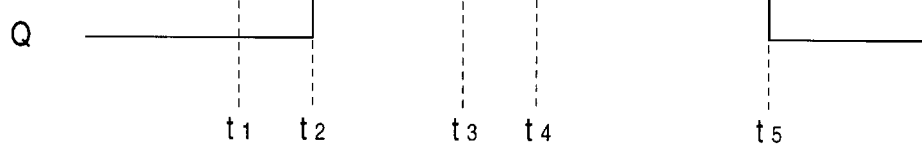
t$_1$  t$_2$    t$_3$  t$_4$    t$_5$

SWITCHING DEVICE

BACKGROUND OF THE INVENTION

1. Field of the Invention

This invention relates to a switching device and, in particular, to a switching device which is used to supply power from a battery selectively to one of plurality loads provided in a car.

2. Background

Conventionally, in a car, in order to supply power selectively to one of a plurality of electrical parts (which are hereinafter referred to as loads) according to the operations of operation switches such as an ignition key, a light switch, an audio switch and the like, there are provided a large number of switching circuits.

In this case, FIG. 8 shows a schematic view of the above-mentioned conventional switching circuits. In particular, a battery 1 is connected to a junction block (J/B) 2, while the junction block 2 is connected to operation switches SW1, SW2, - - - which are respectively disposed on an operation panel 3. In the junction block 2, there are provided switching circuits which correspond in number to the operation switches SW1, SW2, - - - . The respective switching circuits turn on or off the connection between a power line from the battery 1 and wires respectively connected to the respective loads in accordance with the operations of the operation switches SW1, SW2, - - - .

Due to this arrangement, the battery power can be supplied selectively to one of the loads through the junction block 2 in accordance with the operations of the respective operation switches SW1, SW2, - - - . For example, if a headlight switch is moved on, then the power line from the battery 1 is electrically connected to wires respectively leading to headlights 4A and 4B, so that the battery power can be supplied to the headlights 4A and 4B to thereby turn on the headlights 4A and 4B.

Besides the loads such as the headlights 4A and 4B to which the power is directly supplied through the junction block 2, there are also disposed other types of loads, such as motors 5A and 5B respectively used to drive power windows, to which the power output from the junction block 2 is supplied through switching circuits 6A and 6B. These switching circuits 6A and 6B can be controlled or switched by operation switches 7A and 7B, respectively.

The present junction block 2 is actually structured as shown in FIG. 9. That is, the junction block 2 includes a plurality of relays L1, L2, L3, - - - . These relays L1, L2, L3, - - - are divided to relays of a type that the on/off states thereof are controlled directly by their corresponding operation switches SW to thereby apply the current directly to their corresponding loads, such as the relays L1 and L2 which respectively correspond to the above-mentioned headlights 4A and 4B and the on/off states of which are controlled directly by their corresponding operation switches SW1 and SW2 to thereby be able to apply the current directly to their respective loads or the headlights 4A and 4B; and, relays of another type that the on/off states thereof are controlled in accordance with the state of an ignition switch 8, such as the relay L3.

Among the relays, to the relays L1 and L2, there is supplied the battery power from the battery 1 through a fusible link (FL) 9 and fuses F1 and F2. In such power supply, if a large current of an allowable value or more flows through the power line connecting the battery 1 and junction block 2, then the fusible link 9 is blown out, and, if an overcurrent of an allowable value or more flows through a wire (a harness) connecting the junction block 2 and each of the loads, then the fuses F1 and F2 are blown out, thereby being able not only to prevent the whole power line from emitting smoke or catching fire but also to prevent an overcurrent from flowing into the loads. Similarly, to the relay L3, there is supplied the battery power from the battery 1 through the fusible link 9, while the output terminal of the relay L3 is connected to the respective loads 5A and 5B through fuses F3, F4 and relays L4, L5.

By the way, in recent years, with the progress of the semiconductor manufacturing technology, it has been easy to obtain semiconductor switches which are excellent in performance and are inexpensive. In view of this, there has been proposed a switching circuit which uses such semiconductor switches instead of the above-mentioned relays L1, L2, - - - that can be operated by means of mechanical contacts.

This type of switching circuit, generally, has a protection function which can protect a semiconductor switch against an overcurrent or overheating. Therefore, when a current of a rated current or larger flows into the semiconductor switch, or when the semiconductor switch is raised up to a given temperature or higher, the semiconductor switch can be forcibly turned off to thereby protect the semiconductor switch.

Now, in FIG. 10, as an example of a switching circuit using the above-mentioned semiconductor switch, there is shown a switching circuit 30 which is referred to as an intelligent power switch. The switching circuit 30 is substituted for each of the above-mentioned relays L1, L2, - - - , that is, it is connected at the position of each of the relays L1, L2, - - - . For example, referring to a case in which the switching circuit 30 is connected in place of the relay L1, the fuse F1 (FIG. 9) is connected to a power input terminal 12, while the load 4A is connected to an output terminal 13. Also, the operation switch SW1 is connected to a control signal input terminal 14. Here, in the switching circuit 30, in fact, if the operation switch SW1 is moved ON, then, as an on control signal, for example, a control voltage of 5 [V] is supplied from the operation switch SW1 to the control signal input terminal 14; and, if the operation switch SW1 is moved OFF, then a control voltage generation part (not shown), which prevents the supply of the control voltage, is interposed between the operation switch SW1 and control signal input terminal 14.

The switching circuit 30 includes an abnormal signal output part 41 which is used to notify an external device of the abnormal condition of the switching circuit 30 in accordance with an output voltage value $V_{OUT}$ from the semiconductor switch. The abnormal signal output part 41, as shown in FIG. 8, is connected to an abnormal display part 43 through a CPU (central processing unit) 42. In particular, if an overvoltage is applied to the semiconductor switch 32 of the switching circuit 30, or if an overcurrent flows in the semiconductor switch 32, or if the semiconductor switch 32 is overheated, then the protection function of the switching circuit 30 is activated to thereby forcibly move the semiconductor switch 32 off. That is, the abnormal signal output part 41 detects this abnormal condition and sends an abnormal signal to the CPU 42. In accordance with the abnormal signal, the CPU 42 judges which switching circuit 30 is out of order and what kind of abnormal condition has occurred, and allows the abnormal display part 43 to display the judgment results.

Next, description will be given below of the structure of the switching circuit 30 which includes the above-mentioned type of intelligent power switches. The switching circuit 30 applies a power voltage $V_B$ to a π MOS-FET 32 through the input terminal 12 thereof connected to the fusible link FL9 and allows a driver 33 to control the on/off states of the π MOS-FET 32.

Also, the switching circuit 30 further includes an overvoltage detect circuit 34 which, when the power voltage $V_B$ is an overvoltage, detects the overvoltage, an current detect circuit 35 which compares a voltage value based on a current value flowing between the drain and source of the π MOS-FET 32 with a reference voltage $V_{ref}$ from a reference voltage generation circuit 33A to thereby detect an overcurrent, and a temperature detect circuit 36 which compares a temperature voltage value $V_T$ obtained by a temperature sensor (not shown) disposed in the neighborhood of the π MOS-FET 32 with the reference voltage $V_{ref}$ to thereby detect the overheating of the π MOS-FET 32. The detect results of the respective detect circuits 34, 35 and 36 are inputed to a NOR circuit 37. Also, to the NOR circuit 37, there is input a control voltage $V_{IN}$ through an inverter 38.

The output of the NOR circuit 37 is applied to the driver 33 and charge pump 39. The charge pump 39 is operated only when the output of the NOR circuit 37 is positive logic; in particular, the charge pump 39 generates a drive voltage necessary to turn on the π MOS-FET 32 by increasing a power voltage $V_{DD}$ stabilized by a regulator 40, and supplies the thus generated drive voltage to the driver 33. If the output of the NOR circuit 37 is positive logic, the driver 33 applies the drive voltage generated by the charge pump 39 to the gate of the π MOS-FET 32 to thereby turn on the π MOS-FET 32. On the other hand, if the output of the NOR circuit 37 is positive logic, the driver 33 does not apply the above-mentioned drive voltage to the gate of the π MOS-FET 32 to thereby turn off the π MOS-FET 32.

Also, in the switching circuit 30, the output voltage $V_{OUT}$ is supplied to the abnormal signal output part 41 through an inverter 44. The abnormal signal output part 41 includes a channel MOS-FET 41A which is turned off when the π MOS-FET 32 is controlled ON and the output voltage $V_{OUT}$ is a high voltage. On the other hand, when the π MOS-FET 32 is controlled or turned off and the output voltage $V_{OUT}$ is a low voltage, the channel MOS-FET 41A is turned on. Also, the drain terminal 41B of the channel MOS-FET 41A is pulled up.

Therefore, in the CPU 42 (FIG. 8), when there is found no potential difference between the drain terminal 41B and source terminal 41C of the MOS-FET 41A, it can be judged that the protection function is not in operation in the switching circuit 30 (that is, no abnormal condition is found). On the other hand, if there is found any potential difference between the drain terminal 41B and source terminal 41C of the MOS-FET 41A, it can be judged that the protection function is in operation in the switching circuit 30 (that is, an abnormal condition has occurred).

By the way, in the switching circuit using the above-mentioned semiconductor switches, in order to turn on each of the semiconductor switches, a drive voltage higher than the power voltage must be applied to the control input terminal of the semiconductor switch. For this reason, in the switching circuit of this type, there is provided the above-mentioned charge pump 39 in order to generate such drive voltage.

However, since the charge pump 39 basically includes an oscillator for senerating a square wave pulse and a booster circuit for boosting the power voltage using the square waveform pulse, there occurs oscillation noise which interferes directly with the power line, or there occurs radiant noise which interferes with the signal line. As a result of this, parts connected to the power line easily malfunction and, especially when the parts are digital equipment, they more easily malfunction.

In view of the above, conventionally, there is provided on the power line a noise remove circuit which is used to remove the noise generated from the charge pump 39. However, because the noise remove circuits are provided on the charge pumps 39 one for one, the structure of the switching circuit is complicated in correspondence to the provision of the noise remove circuits.

Also, in the above-mentioned switching circuit 30 including switches which are referred to as intelligent power switches, since the abnormal signal output part 41 is directly connected to the power line, the abnormal signal output part 41 is influenced greatly by the noise, which raises a possibility that the abnormal signal output part 41 can output a wrong abnormal signal due to the noise.

SUMMARY OF THE INVENTION

The present invention aims at eliminating the above-mentioned drawbacks found in the conventional switching devices. Accordingly, it is an object of the invention to provide a switching device which can reduce effectively the noise that is generated from a booster device for generating a drive voltage for driving a semiconductor switch.

In attaining the above object, according to the invention, there is provided a switching device which, as shown by a basic structure thereof in FIG. 1, includes: a plurality of semiconductor switches 61A, 61B, - - -, 61X which can be turned on in response to the application of a drive voltage Vs to the control input terminal of the present switching device for supplying dc power $V_B$ to be supplied to power input terminals 62A, 62B, 62X to loads 53A, 53B, - - -, 53X respectively connected to output terminals 63A, 63B, - - -, 63X; a charge pump 57 having an oscillation circuit 57A for generating a square waveform pulse and a booster circuit 57B for boosting the voltage of the dc power $V_B$ using the square waveform pulse, for generating the drive voltage Vs necessary to turn on the semiconductor switches 53A, 53B, - - -, 53X; and, drive voltage application devices 69A, 71A, 69B, 71B, - - -, 69X, 71X which are provided respectively in correspondence to the above-mentioned plurality of semiconductor switches 61A, 61B, - - -, 61X, can input therein the drive voltage Vs and on/off control signals $S_{OA}, S_{OB}, - - -, S_{OX}$ given from external equipment, and, when the on/off control signals $S_{OA}, S_{OB}, - - -, S_{OX}$ turn on their corresponding semiconductor switches 53A, 53B, - - -, 53X, allows the drive voltage Vs to be applied to the drive voltage application devices 69A, 71A, 69B, 71B, - - -, 69X, 71X, wherein the single charge pump 57 is shared in common by the plurality of semiconductor switches 61A, 61B, - - -, 61X, and the plurality of semiconductor switches 61A, 61B, - - -, 61X can be driven by the drive voltage Vs that is generated by the single charge pump 57.

In the above-mentioned structure, since the single charge pump 57 is shared in common by the plurality of semiconductor switches 61A, 61B, - - -, 61X when compared with the conventional structure in which a plurality of charge pumps are respectively provided on the plurality of semiconductor switches 61A, 61B, - - -, 61X, the amount of noise generated can be reduced and the generated noise can be dealt with at a single place, which makes it possible to remove the noise in a simple manner.

Also, in the switching device according to the invention, as shown by the basic structure view thereof in FIG. 1, the plurality of semiconductor switches 61A, 61B, - - -, 61X are respectively incorporated in their corresponding intelligent power switches 55A, 55B, - - -, 55X, the intelligent power switches including: load open detect devices 100A, 100B, - - -, 100X which respectively monitor currents or voltages flowing through the output terminals of the semiconductor switches 61A, 61B, - - -, 61X to thereby detect whether the connections between the semiconductor switches 61A, 61B, - - -, 61X and loads 53A, 53B, - - -, 53x are open or not; and, protect devices 69A, 70A, 71A, 69B, 70B, 71B, - - -, 69X, 70X, 71X which respectively detect the temperatures of the semiconductor switches 61A, 61B, - - -, 61X and currents flowing through the semiconductor switches 61A, 61B, - - -, 61X, and, in accordance with the detect results, sends out off control signals to the drive voltage application devices 69A, 71A, 69B, 71B, - - -, 69X, 71X to thereby protect the semiconductor switches 61A, 61B, - - -, 61X against overheating or overcurrents, the intelligent power switches 55A, 55B, - - -, 55X further including output terminals 107A, 107B, - - -, 107X which, when load open conditions are detected by the load open detect devices 100A, 100B, - - -, 100X or when the protect devices 69A, 70A, 71A, 69B, 70B, 71B, - - -, 69X, 70X, 71X are operated, output abnormal signals representing such load open conditions or such operations of the protect devices.

In the above structure, due to use of only one charge pump 57, the noise is also hard to be transmitted to the output terminals 107A, 107B, - - -, 107X for outputting the abnormal signals, which makes it possible to output the abnormal signals in proper states, thereby being able to improve the intelligent power switches 55A, 55B, - - -, 55X in reliability.

Further, in the switching device according to the invention, the charge pump 57 is covered with metal and, on the power line on the output side of the charge pump 57, there is provided a noise remove device 58 which is used to remove the noise that is generated from the charge pump 57.

In the above structure, radiant noise from the charge pump 57 can be removed by the metal covering the charge pump 57, and the noise transmitted onto or interfering into the power line by the charge pump 57 can be removed by the noise remove device 58 provided on the power line.

BRIEF DESCRIPTION OF THE DRAWINGS

FIGS. 5A to 5D show a timing chart to explain the operation of a JK flipflop shown in FIG. 4;

DETAILED DESCRIPTION OF THE PREFERRED EMBODIMENTS

Now, description will be given below in detail of an embodiment of a switching device according to the invention with reference to the accompanying drawings.

(1) General Structure of Switching Device

Figure 1:
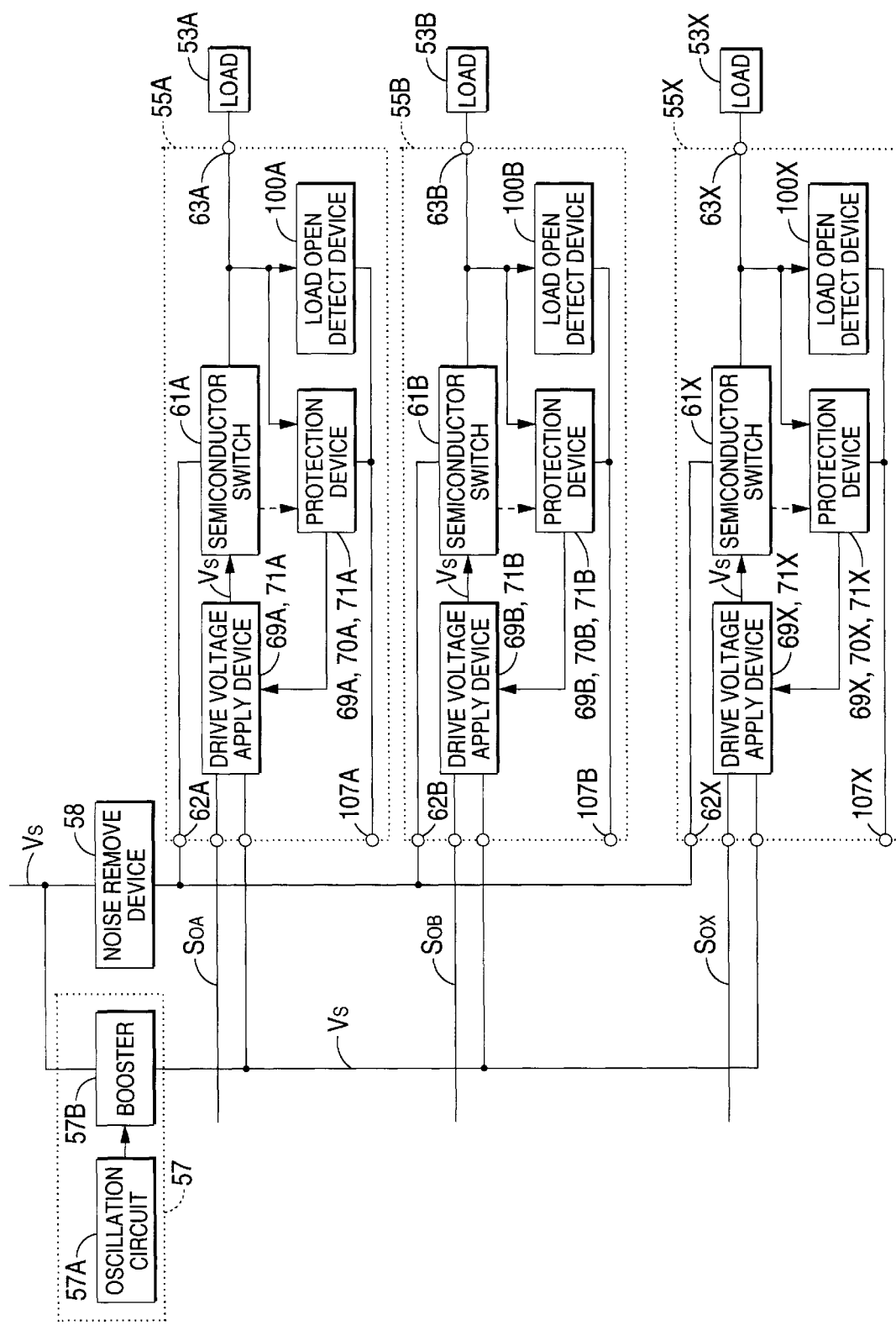
FIG. 1 is a block diagram of the basic structure of a switching device according to the invention.
Figure 2:
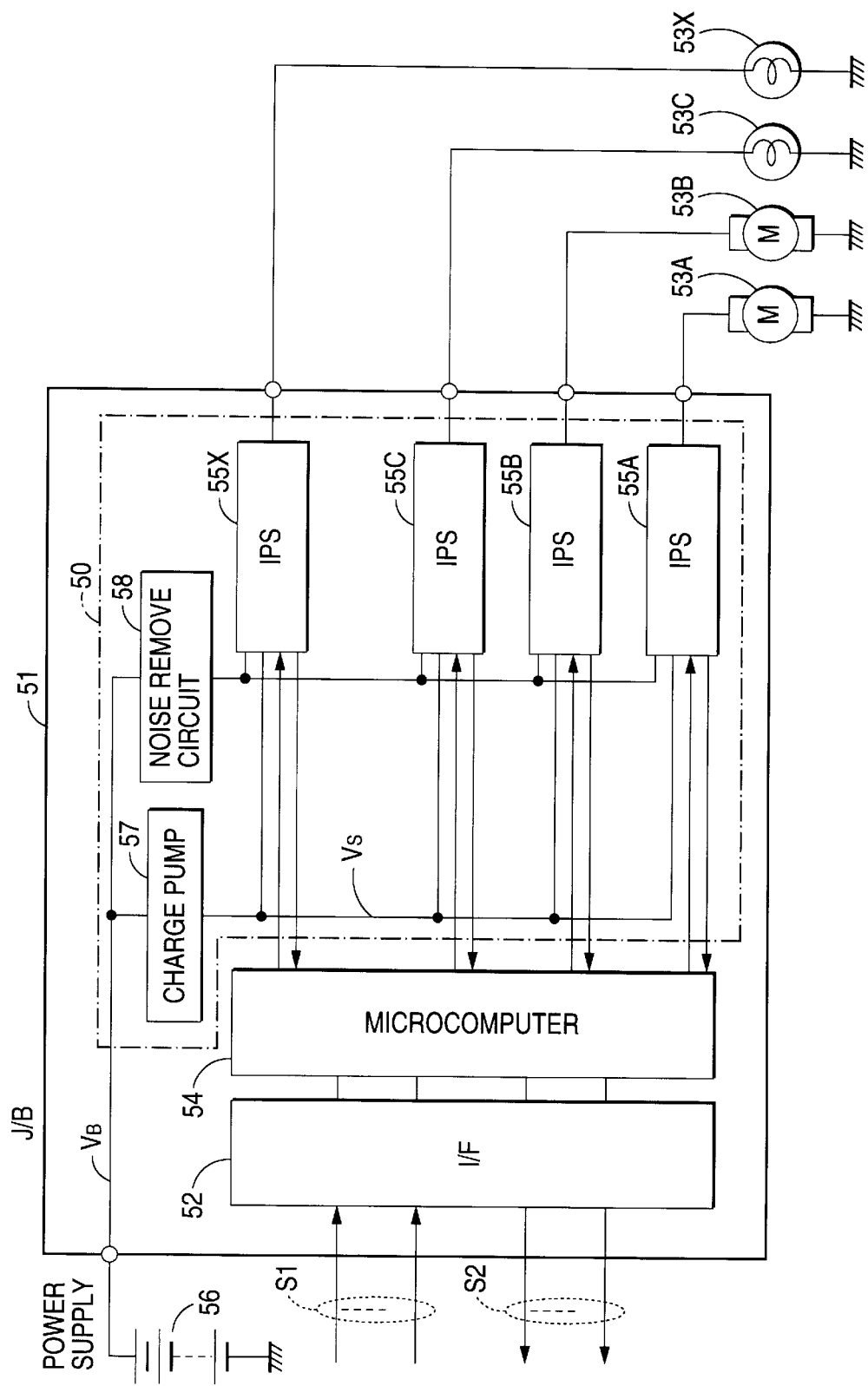
FIG. 2 is a block diagram of an embodiment of a switching device according to the invention.

In particular, FIG. 2 shows the general structure of a switching device 50 according to the invention, in which the switching device 50 is disposed within a junction block (J/B) 51. The switching device 50 includes an interface (I/F) 52 to which there are input switching control signals S1 respectively given from operation switches (not shown) respectively corresponding to loads 53A, 53B, 53C, - - -, and 53X. And, the thus input switching control signals S1 are then supplied to a microcomputer 54.

Here, the switching device 50 includes IPS (Intelligent Power Switch) 55A, 55B, 55C, - - -, 55X respectively corresponding to the loads 53A, 53B, 53C, - - -, 55X. That is, the microcomputer 54 sends out the switching control signals S1 (which is hereinafter referred to as control signals S1 simply) from the operation switches corresponding to the loads 53A, 53B, 53C, - - -, and 53X to their corresponding IPS 55A, IPS 55B, IPS 55C, - - -, and IPS 55X. Thus, the respective IPSes 55A, 55B, 55C, - - -, and 55X can be controlled to turn on or off in accordance with the switching operations of their respective operation switches, so that the power from a battery 56 can be selectively supplied to one of the loads 53A, 53B, 53C, - - -, and 53X.

The microcomputer 54 receives from the respective IPSes 55A, 55B, 55C, - - -, and 55X information as to whether they are activating their respective self-protection functions (overheating protection, overvoltage protection) or not. Also, the respective IPSes 55A, 55B, 55C, - - -, and 55X, as will be discussed later, include current detect parts for detecting the values of currents flowing through the semiconductor switches, and thus they can send out the detect results to the microcomputer from the their current detect parts. In accordance with the detect results, the microcomputer 54 calculates the current time product of the currents flowing through the semiconductor switches, and when the current time product is equal to or greater than a given threshold value, the microcomputer 54 sends out control signals for controlling or turning off the semiconductor switches to the IPS 55A, 55B, 55C, - - -, and 55X, respectively.

In the present embodiment, when the microcomputer 54 detects in accordance with the above-mentioned current time product that a current having a characteristic near the smoke producing characteristics of wires connecting the IPSes 55A, 55B, 55C, - - -, and 55X with the loads 53A, 53B, 53C, - - -, and 53X flows through the semiconductor switches of the IPSes 55A, 55B, 55C, - - -, and 55X, then the microcomputer 54 controls or turns off the semiconductor switches of the IPSes 55A, 55B, 55C, - - -, and 55X, respectively.

Due to this, in the present switching device 50, it is possible to omit fuses which must be conventionally provided in the front stages of the IPSes 55A, 55B, 55C, - - -, and 55X in order to protect the wires. Also, if the microcomputer 54 detects that the current flowing through the semiconductor switches is an abnormal current, then the microcomputer 54 sends out an abnormal signal S2 through the interface 52 to thereby inform an abnormal display part (not shown), which has an indicator lamp or the like, to the effect that the current is an abnormal current.

In addition to the above structure, in the present switching device 50, a charge pump 57, which is used to generate a drive voltage Vs for turning on the semiconductor switches of the IPSes 55A, 55B, 55C, - - -, and 55X, is provided in such a manner that it can be shared in common by the plurality of IPSes 55A, 55B, 55C, - - -, and 55X. That is, a plurality of semiconductor switches can be driven by the drive voltage Vs that is generated by the single charge pump 57. Also, on the power line between the charge pump 57 and the IPSes 55A, 55B, 55C, - - -, and 55X, there is provided a noise remove circuit 58 including, for example, an LC filter, so that the noise remove circuit 58 can remove the noise that goes or interferes into the power line due to the oscillating operation of the charge pump 57.

Thanks to this, in the present switching device 50, since the noise to be generated from the charge pump 57 can be controlled to a minimum and the noise interfering into the power line can be removed by a single noise remove circuit 58, the structure of the switching device can be simplified. For reference, in the conventional switching device of this type, because charge pumps are provided for the respective semiconductor switches one for one, the noise generated from the charge pumps are very great. That is, such great noise going or interfering into the power line and signal lines has ill effects on the whole of the switching device. Also, in order to remove the ill effects of the noise, it is necessary to provide a plurality of noise remove circuits for the respective semiconductor switches, that is, one for one. Due to this, the switching device is complicated in structure.

Figure 3:
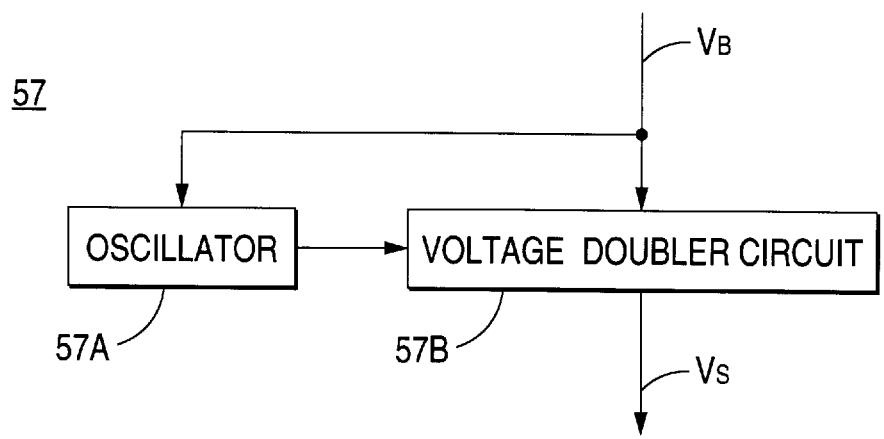
FIG. 3 is a block diagram of the structure of a charge pump.

By the way, the charge pump 57, as shown in FIG. 3, includes an oscillator 57A which is used to receive a power voltage $V_B$ and generate a square waveform pulse having a duty ratio of 50[%] or the like, and a voltage doubler circuit 57B which has a diode or a capacitor and doubles the power voltage $V_B$ using the square waveform pulse, while a drive voltage Vs generated by the voltage doubler circuit 57B and double the power voltage $V_B$, is supplied to the respective IPSes 55A, 55B, 55C, - - -, and 55X.

In fact, the noise generated from the charge pump 57 includes conduction noise and radiant noise: the conduction noise can be removed by the above-mentioned noise remove circuit 58; and, the radiant noise can be restricted to a minimum by covering the charge pump 57 with a metal case.

(2) Detailed structure of the switching device (2-1) Structure of the IPS

Figure 4:
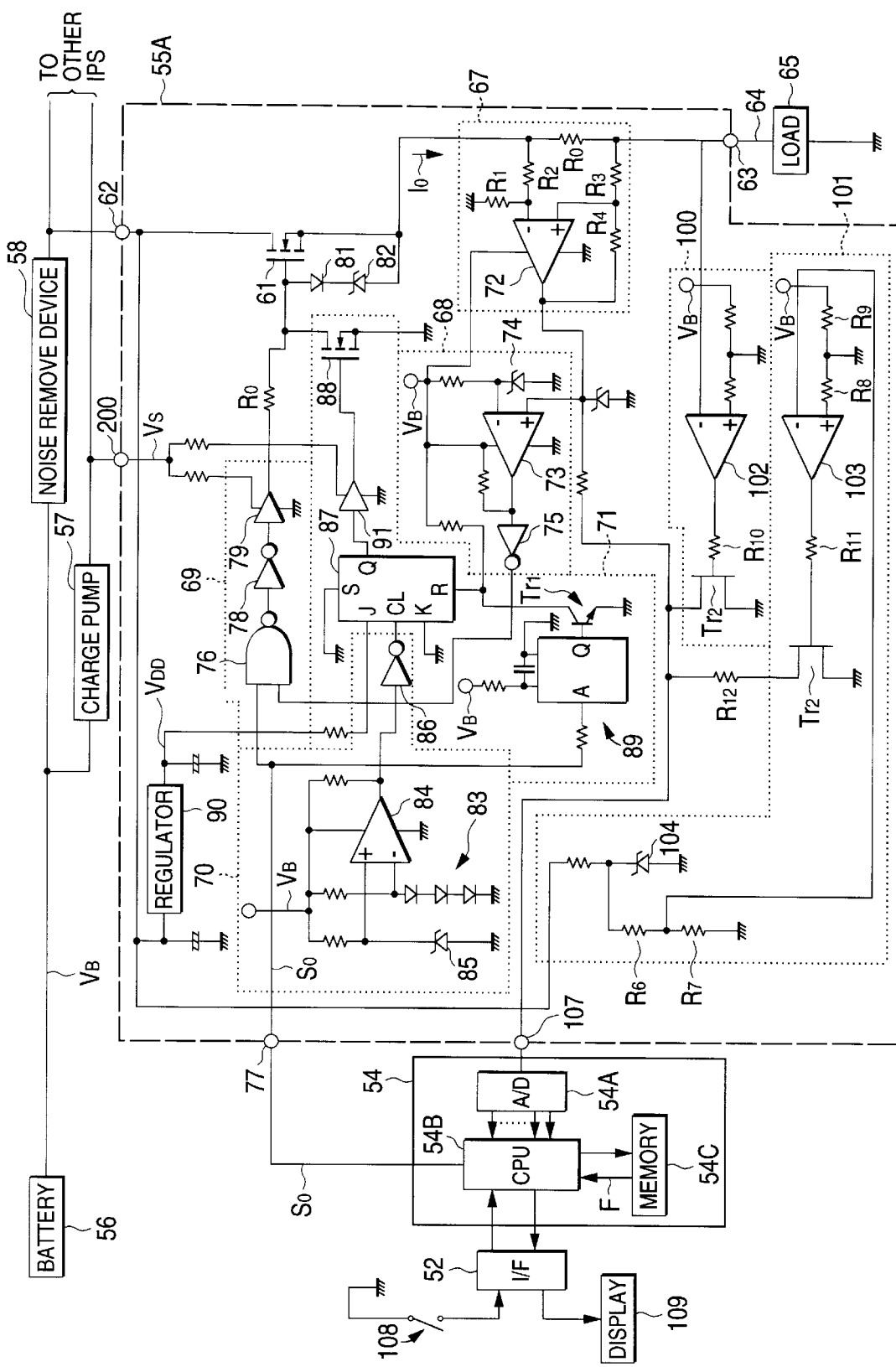
FIG. 4 is a block diagram of the detailed structure of an intelligent power switch to which a switching device according to the invention is applied.

Next, description will be given below in detail of the structures of the switching device 50 and microcomputer 54 according to the present invention with reference to FIG. 4. In FIG. 4, as a representative of the plurality of IPSes 55A, 55B, 55C, - - -, and 55X shown in FIG. 2, the IPS 55A is taken up, and description will be given below of the structure of the thus taken-up IPS 55A as well as the relation between the IPS 55A and microcomputer 54. Here, the structure of the representative IPS 55A will be described below, and the respective structures of the remaining IPSes 55B, 55C, - - -, and 55X are similar to the structure of the IPS 55A. Also, the relation between the IPS 55A and microcomputer 54 will be described below, and the relations between the remaining IPSes 55B, 55C, - - -, and 55X and microcomputer 54 are also similar to the relation between the IPS 55A and microcomputer 54. Therefore, description will be given below of only one IPS 55A as a representative, whereas the description of the remaining IPS 55B, 55C, - - -, and 55X is omitted here.

Now, the IPS 55A is arranged such that, when the power MOS-FET 61 is controlled or turned on or off in accordance with a drive voltage supplied to the gate of the IPS 55A, the IPS 55A supplies the power voltage $V_B$, which is applied to a power input terminal 62 thereof through the noise remove circuit 58 from the battery 56, to a load 65 through an output terminal 63 and a wire 64 only when it is necessary. Also, the IPS 55A has an overcurrent protection function and an overheating protection function in order to protect the MOS-FET 61 against an overcurrent and overheating.

And, the IPS 55A includes the power MOS-FET 61 (which is hereinafter referred to as MOS-FET 61 simply) serving as a main semiconductor switch, a current detect circuit 67 which has a shunt resistor $R_0$ and detects the value $I_0$ of a current flowing through the MOS-FET 61, an overcurrent detect circuit 68 which compares a voltage value corresponding to a current obtained from the current detect circuit 67 with a reference voltage corresponding to the rated current of the MOS-FET 61 to thereby detect whether an overcurrent flows through the MOS-FET 61 or not, an AND circuit 69 which supplies the logical product of the detect result of the overcurrent detect circuit 68 and a control signal $S_0$ to the gate of the MOS-FET 61 as a control voltage to control the on and off states of the MOS-FET 61, a temperature detect circuit 70 which outputs a logical value corresponding to the temperature of the MOS-FET 61, an overheating preventive circuit which, in accordance with the detected logical results of the temperature detect circuit 70, lowers the gate voltage of the MOS-FET 61 forcibly to thereby turn off the MOS-FET 61, and other circuits.

The current detect circuit 67 finds the current value $I_0$ of the current flowing through the shunt resistor $R_0$ according to a voltage across the shunt resistor $R_0$. Here, as the shunt resistor $R_0$, there is used a resistor which has a resistance value of 10 [mω]] and a resistance allowable value of the order of ±5[%]. And, the shunt resistor $R_0$ is arranged such that it uses a one-chip diffused resistor or a polysilicone resistor to thereby be able to detect a current with high precision.

The current detect circuit 67 inputs a voltage at one terminal of the shunt resistor $R_0$ to the noninverting input terminal of a differential amplifier circuit 72 through voltage divider resistors $R_1$ and $R_2$, inputs a voltage at the other terminal of the shunt resistor $R_0$ to the inverting input terminal of the differential amplifier circuit 72 through an input resistor $R_3$, and connects the inverting input terminal of the differential amplifier circuit 72 with the output terminal thereof, thereby being able to output a voltage value corresponding to the output current value $I_0$ obtained from the MOS-FET 61.

The overcurrent detect circuit 68 inputs a detected voltage value from the current detect circuit 67 to the non-inverting input terminal of a comparator 73, inputs a reference voltage value, which is generated by a reference voltage generator 74 and corresponds to the rated current of the MOS-FET 61, to the inverting input terminal of the comparator 73, and outputs a positive potential (which is hereinafter referred to as positive logic, whereas a zero potential is hereinafter referred to as negative logic) when the detected voltage value becomes equal to or greater than the reference voltage value. And, the overcurrent detect circuit 68 outputs the output of the comparator 73 to the AND circuit 69 through an inverter 75. Thus, the overcurrent detect circuit 68 outputs positive logic when a normal current flows through the MOS-FET 61, whereas it outputs negative logic when an overcurrent flows through the MOS-FET 61.

The AND circuit 69 inputs a control signal $S_0$ to an AND NOT circuit 76 through a control signal input terminal 77, inputs a logical value from the overcurrent detect circuit 68 to the AND NOT circuit 76, and finds the AND NOT result of the control signal $S_O$ and logical value. The output of the AND NOT circuit 76 is supplied through an inverter 78 to a buffer 79. And, the output of the buffer 79 is supplied through a resistor $R_5$ to the gate of the MOS-FET 61.

Here, the AND circuit 69 outputs a signal of positive logic (in the present embodiment, a voltage value of 5 [V]) from the inverter 78, for example, when the control signal $S_O$ is positive logic (in the present embodiment, positive logic is set of the order of 5 [V] and negative logic is set for 0 [V]) and when the output from the overcurrent detect circuit 68 is positive logic (which expresses that the output is not an overcurrent). On the other hand, when the control signal $S_O$ is positive logic and the output from the overcurrent detect circuit 68 is negative logic, the AND circuit 69 outputs a signal of negative logic (0 [V]) from the inverter 78.

That is, the AND circuit 69 outputs a signal of negative logic when there is obtained from the overcurrent detect circuit 68 a logical value expressing to the effect that an overcurrent has flown through the MOS-FET 61, or when the control signal $S_O$ is a signal to turn off the MOS-FET 61.

Also, to the buffer 79, there is supplied through a terminal 200 a drive voltage Vs which is generated by the charge pump 57, whereby there can be secured at the gate of the MOS-FET 61 a voltage value which is necessary to turn on the present MOS-FET 61. That is, in this case, the positive logic output from the inverter 78 is set for 5 [V] and this is level shifted by 12 [V] by the buffer 79, with the result that the buffer output becomes 17 [V].

Therefore, when the inverter output is positive logic, a voltage of 17 [V] is applied to the gate of the MOS-FET 61, so that the MOS-FET 61 can be normally turned on. On the other hand, when the inverter output is negative logic, the output of the buffer 79 provides a grounding potential to thereby produce no potential difference between the gate and source of the MOS-FET 61, so that the MOS-FET 61 turns off. Here, between the gate and source of the MOS-FET 61, there are connected a diode 81 and a Zener diode which, when an overcurrent larger than necessary can be applied to the gate of the MOS-FET 61, can bypass the overcurrent to thereby prevent the MOS-FET 61 against damage.

The temperature detect circuit 70 includes a temperature detect element 83 which has a plurality of cascade connected diodes. In fact, the temperature detect element 83 is disposed in the neighborhood of the MOS-FET 61. The temperature detect circuit 70 is arranged such that the temperature detect element 83 is connected to the inverting input terminal of the comparator 84 and a reference voltage generated by a reference voltage generator 85 is input to the non-inverting input terminal of the comparator 84.

Therefore, in the temperature detect circuit 70, as the temperature of the MOS-FET 61 increases, the resistance values of the respective diodes forming the temperature detect element 83 decrease to thereby lower the potential of the inverting input terminal of the comparator 84, and thus when the potential of the inverting input terminal of the comparator 84 is lower than the reference potential, positive logic is output from the comparator 84. For example, the compactor 84 is set such that it outputs the positive logic when the temperature of the MOS-FET 61 is 150[° C.] or higher. And, the present logical output of the comparator 84 is then sent to the overheating preventive circuit 71 through an inverter 86.

The overheating preventive circuit 71 includes a JK flipflop 87 which can be operated in accordance with a logical value and control signal $S_O$ respectively applied from the temperature detect circuit 70, and an FET 88 which can be turned on or off in accordance with the output of the JK flipflop 87 to thereby change the gate voltage of the main MOS-FET 61 and thus turn on or off the MOS-FET 61.

Referring in more detail to the above, the logical output of the temperature detect circuit 70 is input to the clock input CL of the JK flipflop 87, while the collector of a transistor $Tr_1$ is connected to the reset input R of the JK flipflop 87. Here, it is assumed that the control signal $S_O$ is input to the base of the transistor $Tr_1$ through a one-shot multivibrator 89. Therefore, if the control signal $S_O$ is changed from negative logic to positive logic, then the output pulse of the one-shot multivibrator 89 rises to thereby allow a current to flow from the collector of the transistor $Tr_1$ to the emitter thereof, with the result that the potential of the reset input R is lowered and thus the JK flipflop 87 is reset. Also, a power voltage $V_{DD}$ stabilized by a regulator 90 is input to the J input of the JK flipflop 87, while the K input and set input S of the JK flipflop 87 are grounded.

Here, description will be given below of the operation of the JK flipflop 87 with reference to FIGS. 5A to 5D. As shown in FIG. 5A, if the control signal $S_O$ becomes positive logic at a time of $t_1$, then the output pulse of the one-shot multivibrator 89 rises to thereby raise the base potential of the transistor $Tr_1$, with the result that a reset pulse, shown in FIG. 5C, and having a pulse width corresponding to the output pulse is input to the reset input R of the JK flipflop 87 and thus the JK flipflop 87 is rest.

In this state, if the temperature of the MOS-FET 61 becomes a given value or higher at a time of $t_2$, then the logical output to be input to the clock input CL from the temperature detect circuit 70 is inverted to positive logic shown in FIG. 5B, with the result that the Q output of the JK flipflop 87 is also inverted to positive logic. After then, even when the input control signal $S_O$ is inverted to negative logic at a time of $t_3$, or even when the logical output to be input from the temperature detect circuit 70 to the clock input CL of the JK flipflop 87 is inverted to negative logic at a time of $t_4$, the JK flipflop 87 maintains this state and continues to output positive logic as the Q output. After then, at a time of $t_5$, if the control signal $S_O$ is inverted from negative logic to positive logic and a reset pulse is input to the reset input R, then the Q output of the JK flipflop 87 is inverted from positive logic to negative logic, as shown in FIG. 5D.

In this manner, the JK flipflop 87 outputs the Q output of positive logic only when the control signal $S_O$ is in the positive logic state and the output of the temperature detect circuit 70 is inverted to positive logic, and, after then, the JK flipflop 87 maintains this state even when the output of the temperature detect circuit 70 is inverted to negative logic. Here, description will be given below of the reason why the overheating preventive circuit 71 is formed in a latch arrangement and, when the MOS-FET 61 is increased up to a given temperature or higher once, the MOS-FET 61 is continuously kept in the off state until a next control signal $S_O$ to turn on the MOS-FET 61 reaches.

That is, in a case in which the overheating preventive circuit is not formed in a latch arrangement but is so arranged as to control the on and off states of the MOS-FET 61 real time based on the temperature detection, if the MOS-FET 61 is increased in temperature up to a given temperature or higher and thus the MOS-FET 61 is controlled or turned off, then the temperature of the MOS-FET 61 is soon lowered so that the MOS-FET 61 is then controlled or turned on. After then, the temperature of the MOS-FET 61 is raised and the MOS-FET 61 is thus controlled into the off state. However, if such on and off operations are repeated many times for a short time, then there is a possibility that the power can be supplied to the load in an unstabilized manner. In view of this, the MOS-FET 61 is arranged such that it can be returned to the on state only when the control signal $S_0$ is once inverted to negative logic and is thereafter inverted again to positive logic.

The output of the JK flipflop 87 is supplied to the gate of the FET 88 through a buffer 91, similarly to the above-mentioned buffer 79, to which the output of the charge pump 57 is supplied and also which shifts the level of the input by 12 [V]. As a result of this, if the Q output is positive logic (5 [V]), then a voltage of 17 [V] is applied to the gate of the FET 88 and the FET 88 is thereby turned on. On the other hand, if the Q output is negative logic (0 [V]), then only the grounding potential is applied to the gate of the FET 88 and the FET 88 is thereby turned off.

Here, if the FET 88 is turned on, then the gate of the MOS-FET 61 provides a grounding potential, with the result that the MOS-FET 61 is forcibly turned off regardless of the logical output from the AND circuit 69. On the other hand, if the FET 88 is turned off, then the gate potential of the MOS-FET 61 provides a value which corresponds to the logical output from the AND circuit 69.

Thus, in the temperature detect circuit 70 and overheating preventive circuit 71, at least during a period in which the temperature of the MOS-FET 61 is equal to or higher than a given value, the switching state of the MOS-FET 61 can be forcibly kept in the off state, so that the MOS-FET 61 can be prevented against damage due to overheating.

Also, the IPS 55A includes a load open detect circuit 100 and an overcurrent detect circuit 101. The load open detect circuit 100 inputs a voltage obtained by dividing the power voltage $V_B$ to the non-inverting input terminal of a comparator 102. As a result of this, in a so called load open state, for example, when a switch (not shown) interposed between the output terminal 63 and load 64 is switched to the off state, the load open detect circuit 100 allows the comparator 102 to output a positive logic signal which expresses the load open state.

In the overvoltage detect circuit 101, a reference voltage, which is obtained by passing the power voltage $V_B$ through a Zener diode 104 and voltage dividing resistors $R_6$ and $R_7$, is input to the inverting input terminal of the comparator 103, while, the power voltage $V_B$ is input to the non-inverting input terminal of the comparator 103 after the power voltage $V_B$ is divided by the voltage dividing resistors $R_8$ and $R_9$. As a result of this, when the power voltage $V_B$ having an overvoltage is output from the battery 56, the overvoltage detect circuit 101 allows the comparator 103 to output a positive logical signal which expresses to the effect that an overvoltage is output as the power voltage $V_B$.

And, the output of the comparator 102 is applied through a resistor $R_{10}$ to the gate of a transistor $Tr_2$, while the output of the comparator 103 is applied through a resistor $R_{11}$ to the gate of a transistor $Tr_3$. Here, the drain of the transistor $Tr_2$ is connected to an intermediate portion between the output of the current detect circuit 67 and a current monitoring output terminal 107, while the source of the transistor $Tr_2$ is grounded. Also, the drain of the transistor $Tr_3$ is connected through a resistor $R_{12}$ to an intermediate portion between the output of the current detect circuit 67 and a current monitoring output terminal 107, while the source of the transistor $Tr_3$ is grounded.

As a result of this, when the load is open, the potential of the current monitoring output terminal 107 is lowered almost down to the zero potential by the transistor $Tr_2$. On the other hand, when the power voltage $V_B$ is an overvoltage, the potential of the current monitoring output terminal 107 is lowered down to a potential which is higher by an amount corresponding to the voltage drop of the resistor $R_{12}$ than when the load is open.

Here, since the current detect circuit 67 includes a differential amplifier circuit 72, the current detect circuit 67 outputs an offset voltage as the current detect output. As a result of this, even when the MOS-FET 61 is controlled in the off state, the output potential of the current detect circuit 67 provides a value which is spaced apart from the zero potential by the offset amount and the potential of the current monitoring output terminal 107 is also an offset potential not the zero potential. However, when the load is open, the potential of the current monitoring output terminal 107 is forcibly lowered down almost to the zero potential and, when the power voltage $V_B$ is an overvoltage, the potential of the current monitoring output terminal 107 is lowered down to a potential which is higher than the potential obtained when the load is open and is lower than the offset potential.

As a result of this, in the IPS 55A, by looking at the potential of the current monitoring output terminal 107, it is easy to judge whether the power is not supplied to the load 65 because the MOS-FET 61 is overheated or an overcurrent flows through the MOS-FET 61 to thereby cause the protection function to operate, or the power is not supplied to the load 65 because the load is open. And, it is also possible to detect that the power voltage $V_B$ is an overvoltage.

That is, as the reason why the power is not supplied to the load 65, there are two reasons: one is that the overheating protection function or overcurrent protection function is caused to operate; and, the other is that the load is open. It is not possible to judge only from the output value of the current detect circuit 67 which is the actual reason why the power is not supplied to the load 65. In view of this, in the IPS 55A, by making positive use of the offset of the current detect circuit 67, the reason why the power is not supplied to the load 65 can be judged with a relatively simple structure.

(2-2) Structure of Microcomputer 54

Here, the microcomputer 54 is arranged such that, in accordance with the voltage of the current monitoring output terminal 107 of the IPS 55A, it monitors a current characteristic including a time element output from the IPS 55A to thereby grasp the state of the load applied onto the wire 64 and, if it judges that a current to cause an excessive load to be allied to the wire 64 is flowing through the wire 64, then it outputs a control signal $S_0$ which is used to forcibly control or turn off the MOS-FET 61. Also, in accordance with the voltage of the current monitoring output terminal 107, the microcomputer 54 judges in the above-mentioned manner the reason why the power is not supplied to the load 65.

The microcomputer 54 allows an analog to digital converter circuit (A/D) 54A to convert the voltage of the current monitoring output terminal 107 at a sampling cycle of, for example, 5 [ms] to digital data of 8 bits and, after then, sends the thus converted 8-bit digital data to a CPU (Central Processing Unit) 54B. The CPU 54B, in accordance with the output data of the A/D converter circuit 54A, detects the value and time of a current which has flown through the wire 64 (that is, current value×time=current time product), compares the detect result with the threshold value data that is stored in a memory 54C, and controls the on and off states of the MOS-FET 61 in accordance with the comparison results.

Figure 6:
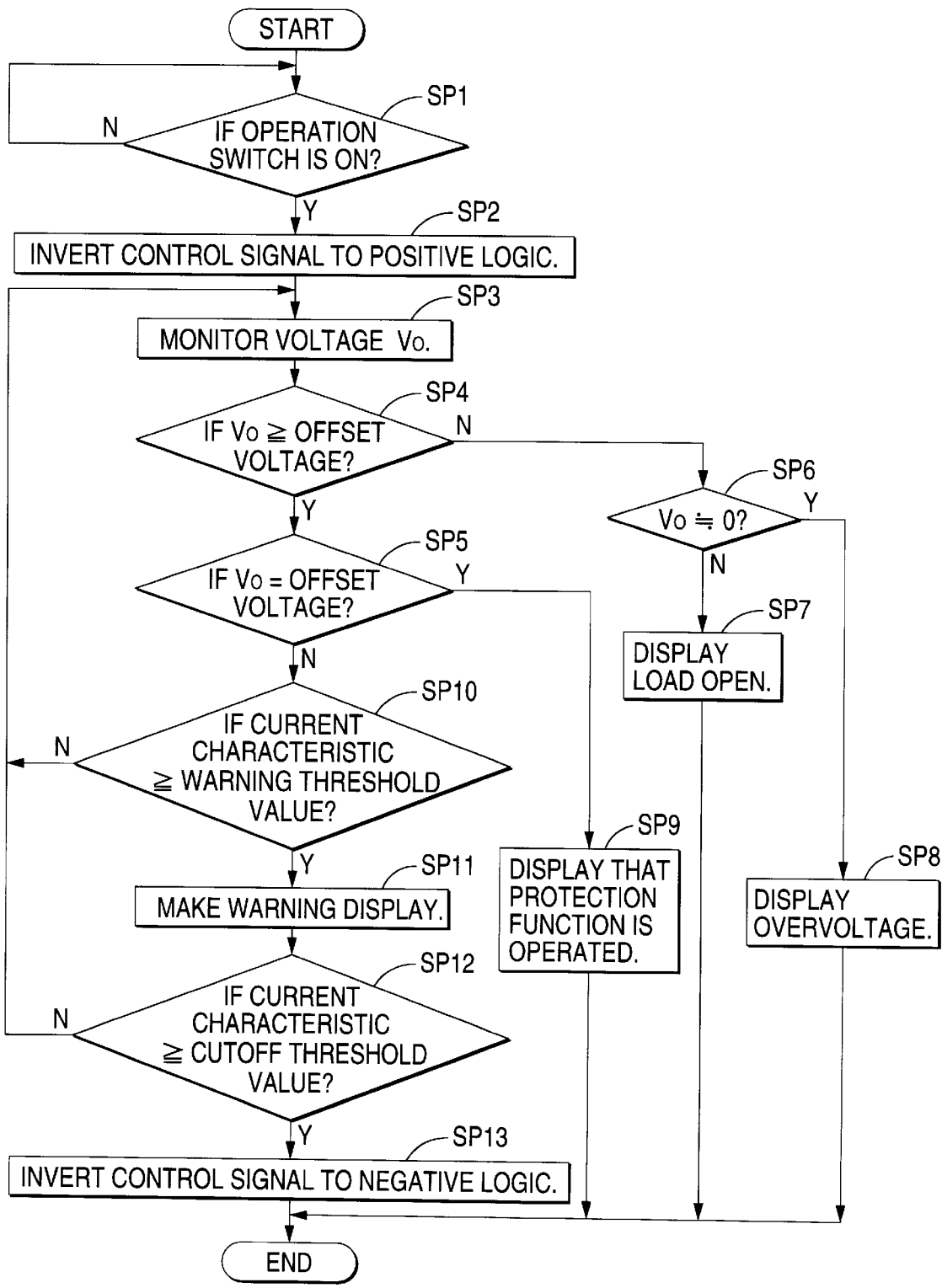
FIG. 6 is a flow chart of a procedure for a current monitoring processing and a switching control processing to be performed by a CPU shown in FIG. 4.

In this operation, the CPU 54B executes such a processing procedure as shown in FIG. 6. That is, at first, in Step SP1, the CPU 54B judges whether an operation switch 108 corresponding to the IPS 55A is operated ON or not and, if it is judged that the operation switch 108 is operated ON, then the CPU 54B advances to Step SP2, in which it inverts the control signal $S_O$ to positive logic and thus causes the MOS-FET 61 to be operated ON.

Next, in Step SP3, the CPU 54B monitors the voltage $V_O$ of the current monitoring output terminal 107. Then, in Step SP4, the CPU 54B judges whether the voltage $V_O$ is equal to or higher than the offset voltage of the differential amplifier circuit 72 or not and, if it is found that the voltage $V_O$ is equal to or higher than the offset voltage, then the CPU 54B moves to Step SP5. On the other hand, in Step SP4, if it is found that the voltage $V_O$ is less than the offset voltage, then the CPU 54B moves to Step SP6, in which it judges whether the voltage $V_O$ is almost equal to zero or not.

To be able to obtain an affirmative result in Step SP6 means that a positive logic signal expressing the open load is obtained by the load open detect circuit 100, the transistor $Tr_O$ is operated ON and the voltage of the current monitoring output terminal 107 is almost zero. In this case, the CPU 54B moves to Step SP7, in which it allows a display part 109 to display that the load is open. On the other hand, to be able to obtain a negative result in Step SP6 means that a positive logic signal indicating that the overvoltage power $V_B$ has been output from the battery 56 is obtained by the overvoltage detect circuit 101, the transistor $Tr_3$ is operated ON and the voltage of the current monitoring output terminal 107 is less than the offset voltage and larger than zero. In this case, the CPU 54B moves to Step SP8, in which it allows the display part 109 to display that the power is an overvoltage.

In Step SP5, it is checked whether the voltage $V_O$ is equal to the offset voltage or not. If it is found equal, then the CPU 54B moves to Step SP9, in which it allows the display part 109 to display that the overheating and overcurrent protection functions are actuated and the MOS-FET 61 is controlled or turned OFF.

Also, if a negative result is obtained in Step SP5, that is, if it is found that the voltage $V_O$ is larger than the offset voltage, then the CPU 54B moves to Step SP10. In Step SP10, the CPU 54B compares the current characteristic (in the present embodiment, a current time product) of a current $I_O$ obtainable from the voltage value of the current monitoring output terminal 107 with a warning threshold value read out from the memory 54C. If the current time product is equal to or more than the warning threshold value, then the CPU 54B moves to Step SP11 and, if the current time product is less than the warning threshold value, then the CPU 54B returns to Step SP3.

In Step SP11, since there is a possibility that the wire 64 can be damaged (can produce smoke) if the current value of the current $I_O$ becomes a little larger or if the flow time of the current $I_O$ increases, the CPU 54B allows the display part 109 to make a warning display to the effect that the MOS-FET 61 is controlled or turned OFF.

Next, in Step SP12, the CPU 54B reads out from the memory 54C a cutoff value selected in consideration of the smoke producing characteristic of the wire 64, and compares the current time product with the cutoff threshold value. If the current time product is equal to or more than the cutoff threshold value, then the CPU 54B moves to Step SP13 and, if the current time product is less than the cutoff threshold value, then the CPU 54B returns to Step SP3. Here, to be able to obtain an affirmative result in Step SP12 means that the wire 64 is in a state near to a smoke producing state and, therefore, in this case, the CPU 54B moves to Step SP13, in which the CPU 54B inverts the control signal $S_O$ to negative logic to thereby turn OFF the MOS-FET 61.

As described above, since the CPU 54B not only controls the on and off states of the MOS-FET 61 in accordance with the switching signals of the operation switch 108 but also, in consideration of a load to be applied to the wire 64 based on the current characteristic of the current $I_O$ actually flowing through the wire 64, controls the on and off states of the MOS-FET 61, the wire 64 can be prevented from producing smoke even if no fuse is arranged in the front stage of the IPS 55A.

Also, as described above, because the IPS 55A includes the load open detect circuit 100 and overvoltage detect circuit 101, the CPU 54B can judge easily what is the reason why the power from the battery 56 is not supplied to the load 65.

Figure 7:
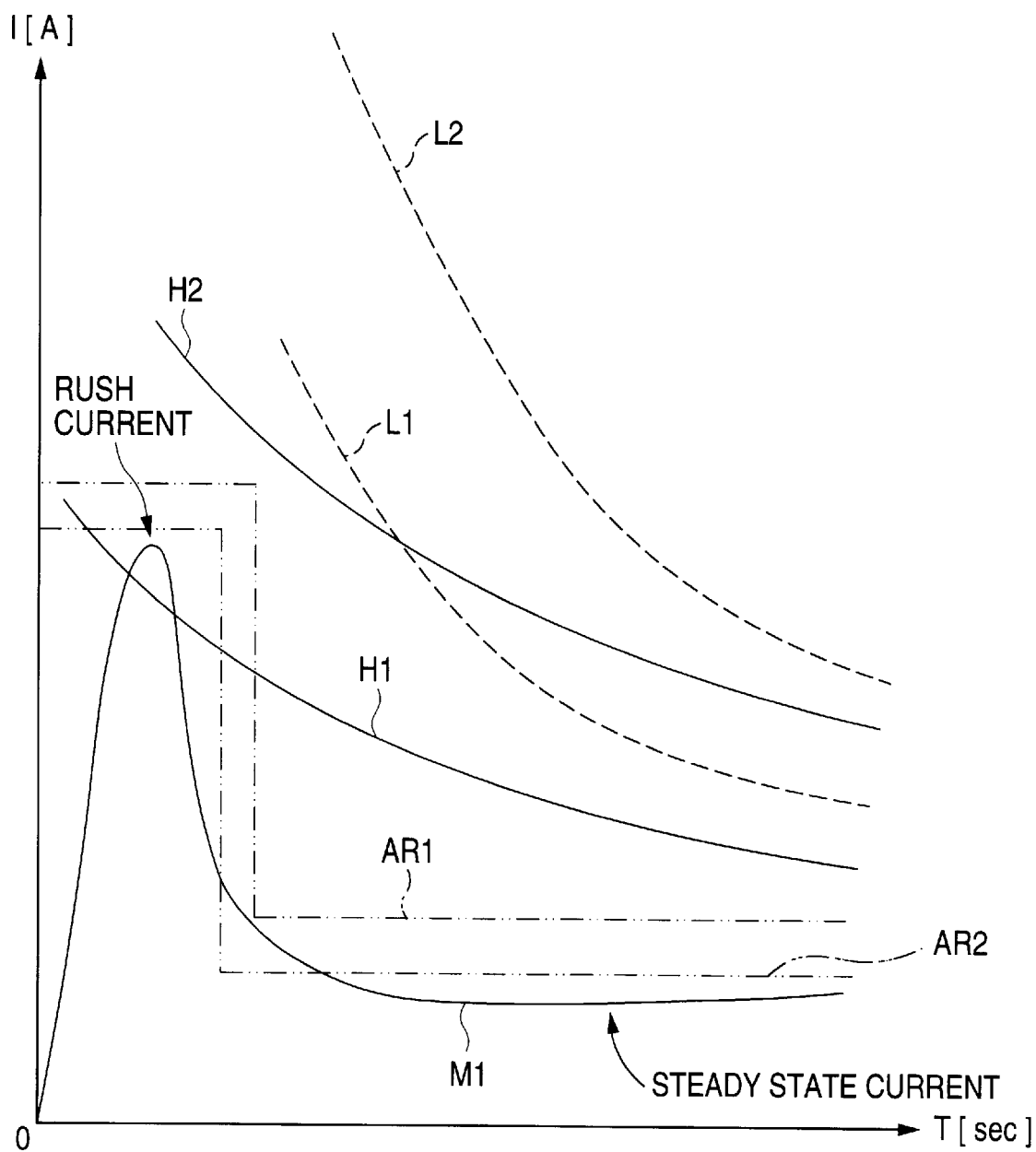
FIG. 7 is a graphical representation of relations among the smoke producing characteristic of a wire harness, the fuse characteristic thereof, and a cutoff characteristic to be provided by a CPU according to the illustrated embodiment.
Figure 8:
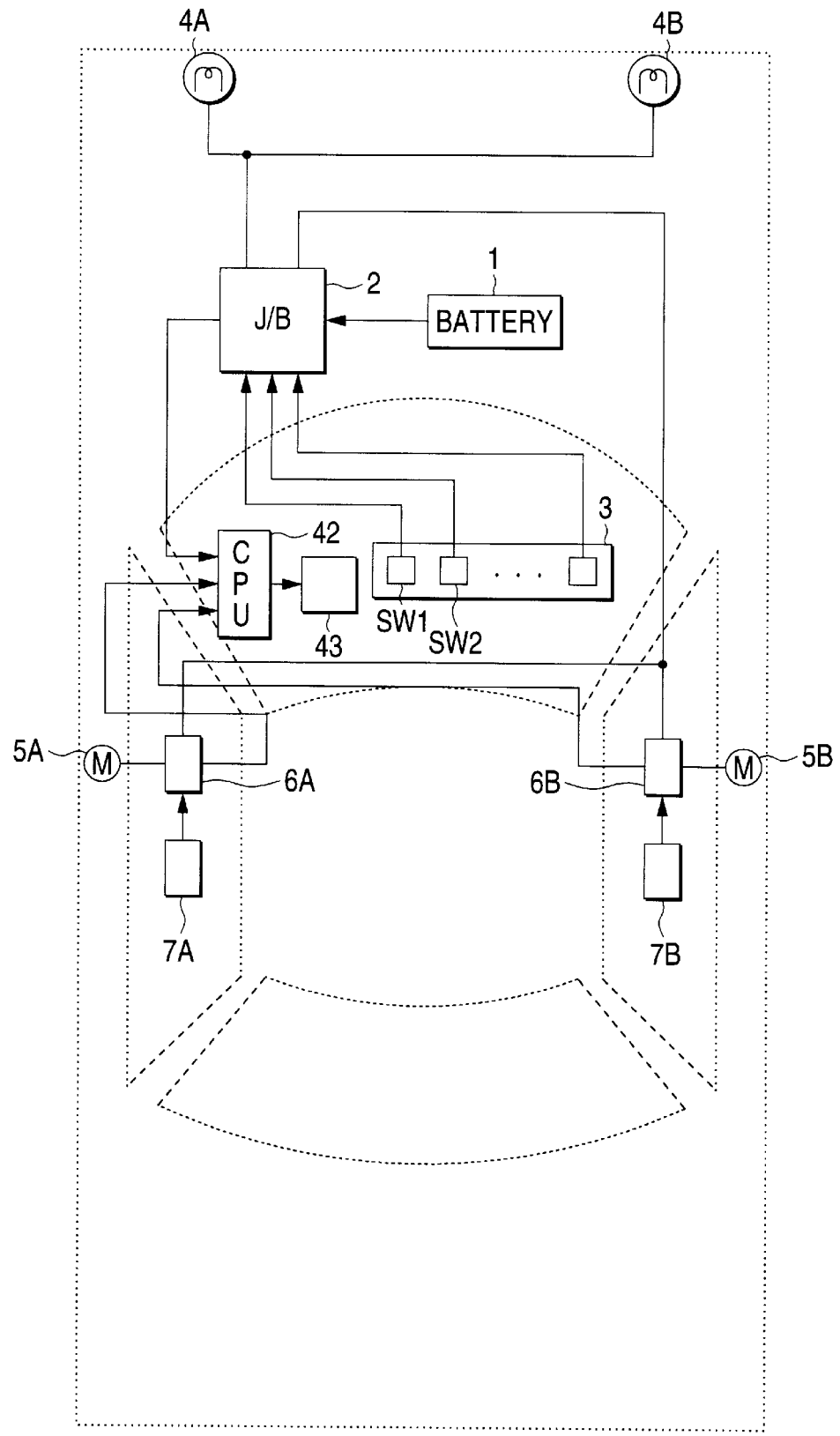
FIG. 8 is a diagrammatic view to explain how to supply a power to the respective loads of a car.
Figure 9:
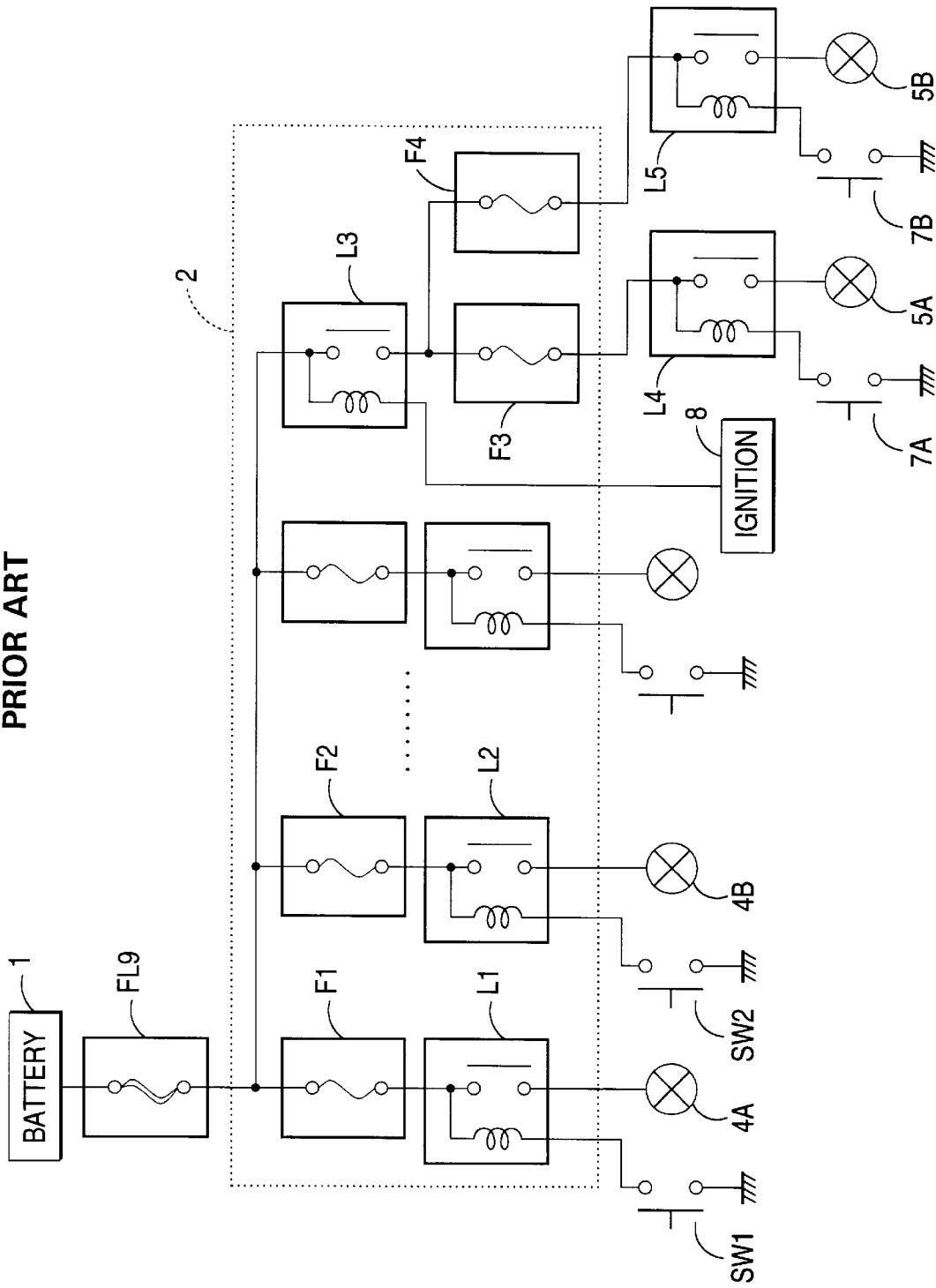
FIG. 9 is a diagrammatic view to explain a junction block using relays having mechanical contacts.
Figure 10:
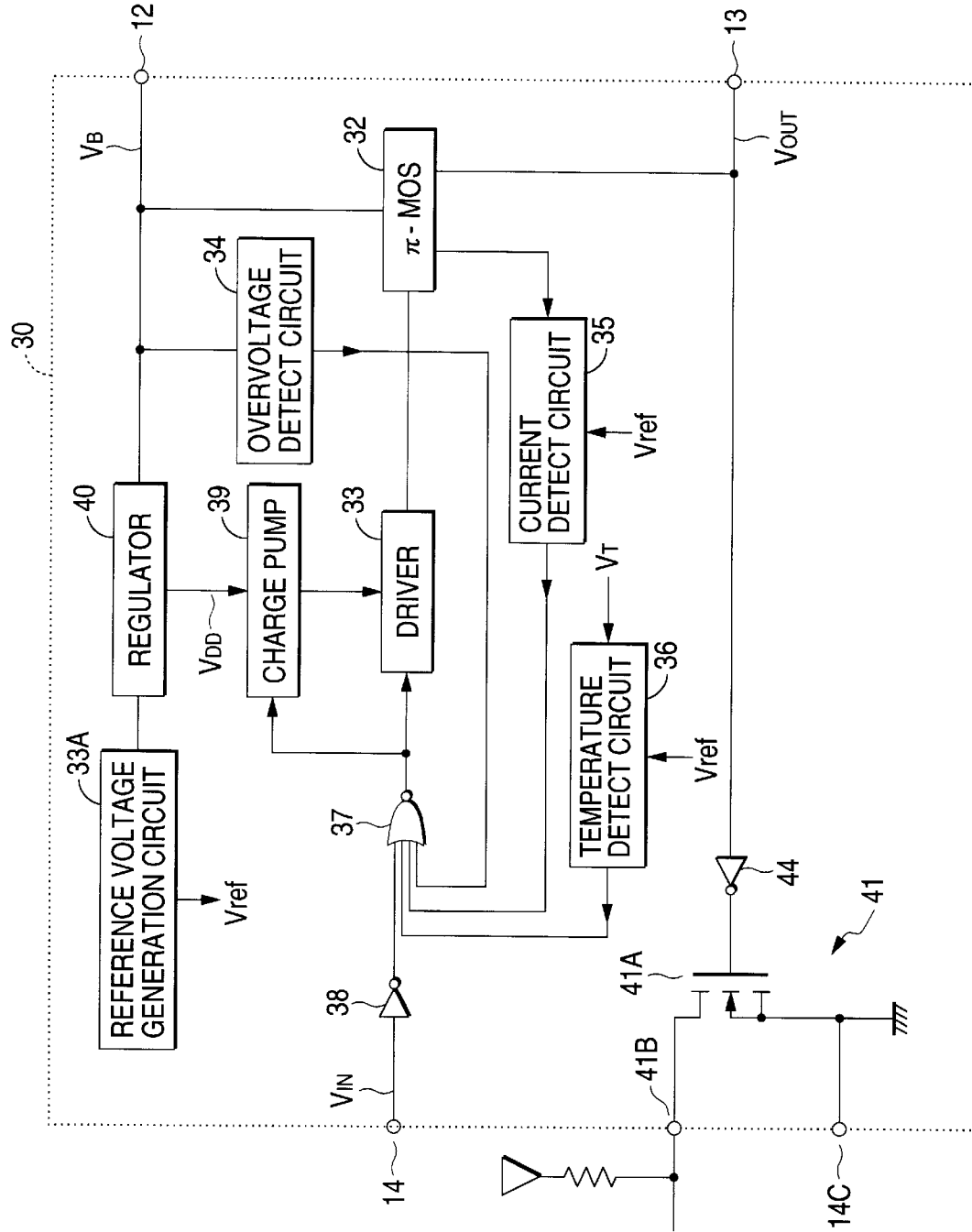
FIG. 10 is a block diagram of the structure of a conventional intelligent power switch.

Now, FIG. 7 shows relations among the smoke producing characteristic of a wire harness, the fuse characteristic of a fuse provided in the front stage of a conventional IPS, and a cutoff characteristic provided by means of the CPU control according to the present embodiment. In particular, a curved line $L_1$ expresses the smoke producing characteristic of a wire harness which includes a relatively thin wire, whereas a curved line $L_2$ represents the smoke producing characteristic of a wire harness which includes a relatively thick wire. Also, a curved line H1 points out the cutoff characteristic of a low-capacity fuse corresponding to a thin wire, whereas a curved line H2 indicates the cutoff characteristic of a low-capacity fuse corresponding to a thick wire. Further, a curved line M1 shows the operation waveform of a load. In addition, a line AR1 expresses an ideal cutoff characteristic of a semiconductor switch.

Here, if a low-capacity fuse is used to the steady state current of a load, then the fuse characteristic H1 of the low-capacity fuse is applied to the rush current portion of the operation waveform M1 of the load, thereby causing the low-capacity fuse to be fused off or cut off. In view of this, if a high-capacity fuse is used, then the fuse characteristic H2 thereof intersects the smoke producing characteristic H1 and thus it is necessary to increase the wire size (that is, the wire having the smoke producing characteristic L2 must be used).

In this manner, in the conventional switching device, the fuse and wire must be selected in consideration of the operation waveform of a load and the like and thus the selection of the fuse and wire is very complicated. On the other hand, according to the present embodiment, simply by storing in the memory 54C, as the threshold data, the ideal cutoff characteristic AR1 with the smoke producing characteristic L1 of the wire 64 and the operation waveform M1 of the load 65 taken into consideration, the wire can be prevented from producing smoke and the operation of the load can be secured over the whole current area without changing the wire size. Here, in FIG. 7, a two-dot chained line AR2 expresses a warning threshold value which is used to allow the display part 109 to make a warning display, while the warning threshold value is stored in the memory 54C together with the above-mentioned cutoff threshold value AR1. And, when the current characteristic (current time product) exceeds the two-dot chained line AR2, the CPU 54B issues an instruction for warning display to the display part 109.

As the result that the IPS 55A and microcomputer 54 are structured in the above-mentioned manner, even if the thickness of the wire 64 and the operation allowable area of the load 65 vary, new threshold value data F corresponding to such variations may only be stored in the memory 54C and there is eliminated the need to change the structure of the hardware.

According to the above-mentioned structure, the charge pump 57, which is used to generate the drive voltage Vs for operating the semiconductor switches of the respective IPSes 55A, 55B, 55C, - - - , and 55X, is shared in common by the plurality of IPSes 55A, 55B, 55C, - - - , and 55X and thus the plurality of semiconductor switches can be driven by the drive voltage Vs generated by the single charge pump 57, whereby the noise to be generated from the charge pump 57 can be controlled to a minimum and the noise going onto the power line can be removed by the single noise remove circuit 58, so that the structure of the switching device according to the present embodiment can be simplified.

Since the charge pump 57 is disposed not inside but outside the IPSes 55A, 55B, - - - , and 55X to thereby be able to reduce further the influences of the noise generated from the charge pump 57 on the IPSes 55A, - - - , and 55X, it is possible to realize the intelligent power switches 55A, 55B, - - - , and 55X which are further improved in reliability.

(3) Other Embodiments

In the above-mentioned embodiment, description has been given of a case in which the switching device according to the invention is applied in such a manner that the drive voltage Vs is supplied to the IPSes 55A, 55B, - - - , and 55X each having such structure as shown in FIG. 4. However, the invention is not limited to this but can be widely applied to a switching device of a type that a drive voltage necessary to drive a plurality of semiconductor switches is applied to the control input terminals of the semiconductor switches in accordance with a switching control signal given from externally.

Also, in the above-mentioned embodiment, description has been given of use of the charge pump 57, as the charge pump, which includes the oscillator 57A for generating a square waveform pulse having a duty ratio of 50[%], and the voltage doubler circuit 57B including a diode and a capacitor for doubling the power voltage $V_B$ using the square waveform pulse. However, according to the invention, the charge pump 57 is not limited to this but an other charge pump can also be used, provided that it includes an oscillator circuit for generating a square waveform pulse and a booster circuit for boosting the voltage of a dc power supply using this square waveform pulse, whereby it can generate a drive voltage necessary to operate the semiconductor switches ON.

Further, in the above-mentioned embodiment, as the drive voltage application devices for applying the drive voltage Vs to the MOS-FET 61, there are used the AND circuit 69 and overheating preventive circuit 71. However, according to the invention, the drive voltage application device is not limited to them but other types of circuits can also be employed, provided that they are so disposed as to correspond to the plurality of semiconductor switches, and further, they can input therein a drive voltage and an on/off control signal given from outside and, when the on/off control signal indicates that the corresponding semiconductor switches should be controlled or operated ON, they can apply the drive voltage to the control input terminals of the semiconductor switches.

Moreover, in the above-mentioned embodiment, the switching device according to the invention is applied to the junction block. However, the invention is not limited to this but it can be widely applied to a switching device of a type that uses a plurality of semiconductor switches.

In addition, in the above-mentioned embodiment, as the semiconductor switch, there is used the MOS-FET 61. However, according to the invention, the semiconductor switch is not limited to this but other types of semiconductor switches can also be used. That is, in this case as well, there can be provided similar effects to the above-mentioned case.

As has been described heretofore, acceding to the first aspect of the invention, the single charge pump is shared in common by the plurality of semiconductor switches and such plurality of semiconductor switches can be driven by the drive voltage that is generated by such single charge pump. That is, when compared with the conventional switching device including a plurality of charge pump respectively corresponding to a plurality of semiconductor switches, the present invention only needs to use a single charge pump instead. This not only can reduce the absolute quantity of noise generated but also can deal with the generated noise at a place, thereby being able to remove the noise with ease.

Also, according to the second aspect of the invention, by applying the first aspect of the invention to the intelligent power switch, the noise is hard to be transmitted to the output terminal thereof for outputting an abnormal signal, which makes it possible to output an abnormal signal in a more reliable manner. That is, the reliability of the intelligent power switch can be improved.

Further, according to the third aspect of the invention, the radiant noise from the charge pump can be removed by the metal that is used to cover the charge pump, and also the noise interfering into the power line due to the charge pump can be removed by the noise remove device which is provided on the power line.

What is claimed is:

1. A switching device, comprising:
    a plurality of semiconductor switches including control input portions to which a drive voltage can be applied, power input portions to which dc power can be supplied, and output portions to which loads are respectively connected, said semiconductor switches which can be turned on to supply said dc power to said loads as said drive voltage is applied to said control input portions;
    a charge pump including an oscillation circuit, which generates a square waveform pulse, and a booster circuit which boosts voltage of said dc power by using said square waveform pulse, said charge pump generating said drive voltage necessary to turn on said semiconductor switches; and
    a plurality of drive voltage application devices respectively disposed to correspond to said semiconductor switches, said drive voltage application devices being arranged to input therein said drive voltage generated by said charge pump and an on/off control signal from outside,
    wherein when said on/off control signal turns on one of said semiconductor switches, said drive voltage is applied to said control input portion of one of said semiconductor switches.

2. The switching device of claim 1, wherein said charge pump is shared in common by said semiconductor switches, and said semiconductor switches are driven by said drive voltage that is generated by said charge pump.

3. The switching device of claim 1, wherein said semiconductor switches are respectively provided in intelligent power switch sections, said intelligent power switch sections respectively include:
    load open detect devices which monitor either current or voltage flowing through said output portions of said semiconductor switches to detect whether said semiconductor switches and said loads are open or not with respect to each other, protection devices which detect temperature of said semiconductor switches and current flowing through said semiconductor switches and can send an off control signal to said drive voltage application devices in accordance with the detection result to protect said semiconductor switches against overheating or overcurrent, and output terminals, under one of the conditions that a load open state is detected by at least one of said load open detect devices and at least one of said protection devices is operated, which output an abnormal signal indicating at least one of said load open state and the operation of said at least one protection device.

4. The switching device of claim 1, wherein said charge pump is covered with metal.

5. The switching device of claim 1, further comprising a noise remove device which removes noise generated from said charge pump on a power line on a output side of said charge pump.

* * * * *